United States Patent
Jang

(10) Patent No.: US 8,114,749 B2
(45) Date of Patent: Feb. 14, 2012

(54) METHOD OF FABRICATING HIGH VOLTAGE DEVICE

(75) Inventor: Joon-Tae Jang, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 129 days.

(21) Appl. No.: 12/630,930

(22) Filed: Dec. 4, 2009

(65) Prior Publication Data

US 2010/0155829 A1 Jun. 24, 2010

(30) Foreign Application Priority Data

Dec. 24, 2008 (KR) .................. 10-2008-0132822

(51) Int. Cl.
 *H01L 21/8222* (2006.01)
(52) U.S. Cl. .. 438/328; 438/400; 438/527; 257/E21.545
(58) Field of Classification Search .................. 438/328, 438/527, 400
 See application file for complete search history.

(56) References Cited

U.S. PATENT DOCUMENTS

| | | | |
|---|---|---|---|
| 7,466,527 B1 * | 12/2008 | Juang | 361/56 |
| 2004/0119116 A1 * | 6/2004 | Byeon et al. | 257/335 |
| 2005/0285188 A1 * | 12/2005 | Khemka et al. | 257/338 |

* cited by examiner

*Primary Examiner* — Thanh Nguyen
(74) *Attorney, Agent, or Firm* — Sherr & Vaughn, PLLC

(57) ABSTRACT

A device for protecting a semiconductor device from electrostatic discharge may include a high voltage first conductivity type well formed in a semiconductor substrate. A first stack region may have a first conductivity type drift region, and a first conductivity type impurity region stacked in succession in the high voltage first conductivity type well. A second stack region may have a second conductivity type drift region, and a second conductivity type impurity region stacked in succession in the high voltage first conductivity type well. A device isolating film formed between the first stack region and the second stack region for isolating the first stack region from the second stack region.

12 Claims, 3 Drawing Sheets

METHOD OF FABRICATING HIGH VOLTAGE DEVICE

The present application claims priority under 35 U.S.C. 119 to Korean Patent Application No. 10-2008-0132822 (filed on Dec. 24, 2008), which is hereby incorporated by reference in its entirety.

BACKGROUND

For protecting an integrated circuit from electrostatic discharge, an ESD (Electrostatic Discharge) protective circuit may be used. A high voltage integrated circuit, which uses a high driving voltage, and is operated in an environment vulnerable to static electricity, such as an automobile, requires an ESD protection level higher than a general logic integrated circuit. In general, a DENMOS (Drain Extended NMOS) or a high voltage diode (HV-Diode) may be used as a high voltage ESD protective device.

Figure 1:
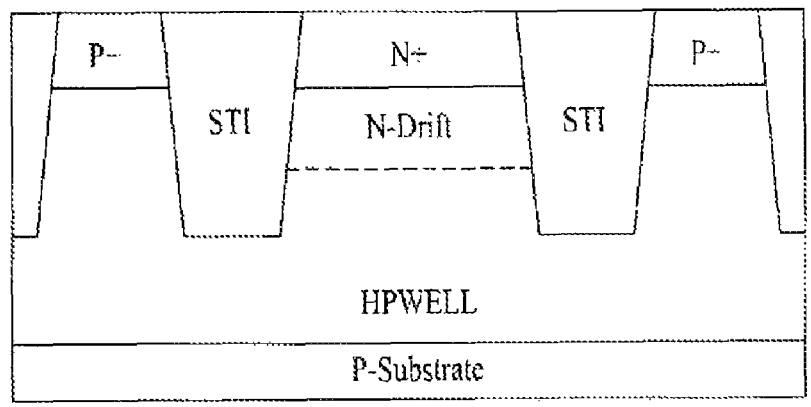

FIG. 1 illustrates a section of a related art HV-diode ESD protective device. Referring to FIG. 1, an HV-diode requires a breakdown voltage about 1.5 times higher than a driving voltage. A drift region N-Drift having an impurity concentration lower than an active region may be formed at an anode region N+ on which the breakdown voltage depends for meeting the above condition.

Semiconductor fabrication processes regularly reduce design rules, increasing a depth of STI (Shallow Trench Isolation) for reducing off-state leakage by means of perfect isolation, resulting in poor efficiency of the ESD protective device. In particular, a resistance increase between two electrodes N+ and P+ within a high voltage well (HP well) can impair a forward bias characteristic, compared to a reverse bias characteristic of a diode device.

SUMMARY

Embodiments relate to semiconductor devices, and, more particularly, to device for protecting a semiconductor device from electrostatic discharge, and a method for fabricating the same. Embodiments relate to a device for protecting a semiconductor device from electrostatic discharge, and a method for fabricating the same, which can improve characteristics of an ESD protective device without an additional impurity injection step.

Embodiments relate to a device for protecting a semiconductor device from electrostatic discharge which may include a high voltage first conductivity type well formed in a semiconductor substrate. A first stack region may have a first conductivity type drift region, and a first conductivity type impurity region stacked in succession in the high voltage first conductivity type well. A second stack region may have a second conductivity type drift region, and a second conductivity type impurity region stacked in succession in the high voltage first conductivity type well. A device isolating film formed between the first stack region and the second stack region for isolating the first stack region from the second stack region.

Embodiments relate to a method for fabricating a device for protecting a semiconductor device from electrostatic discharge which may include forming a first conductivity type well by injecting first conductivity type impurities into a semiconductor substrate; forming a first stack region having a first conductivity type drift region and a first conductivity type impurity region stacked in succession in the high voltage conductivity type well by injecting first conductivity type impurities into the first stack region of the high voltage conductivity type well; forming a second stack region having a second conductivity type drift region and a second conductivity type impurity region stacked in succession in the high voltage conductivity type well by injecting second conductivity type impurities into the high voltage conductivity type well; and forming a device isolation film between the first stack region and the second stack region for isolating the first stack region from the second stack region.

DRAWINGS

FIG. 1 illustrates a section of a related art HV-diode ESD protective device.

Figure 2:
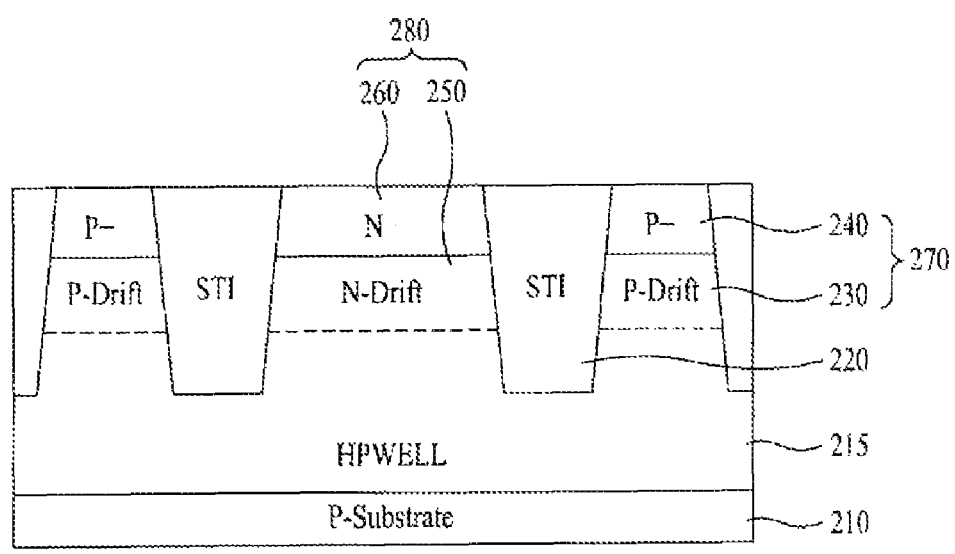

Example FIG. 2 illustrates a section of an ESD protective device in accordance with embodiments.

Figure 3:
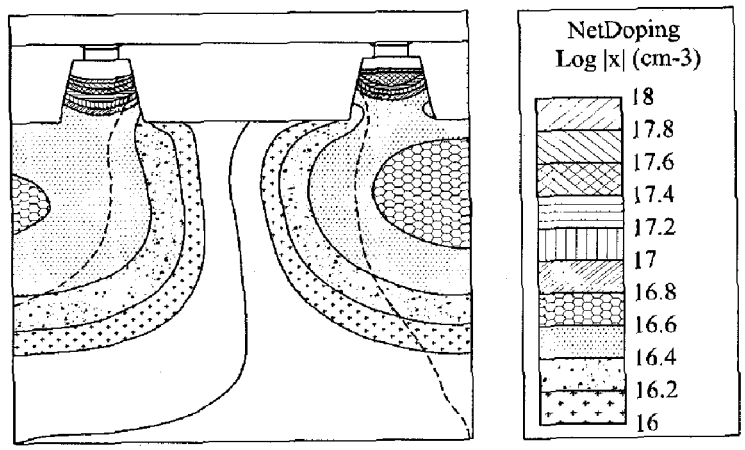

Example FIG. 3 illustrates a net doping profile of a first stacked region in example FIG. 2.

Figure 4:
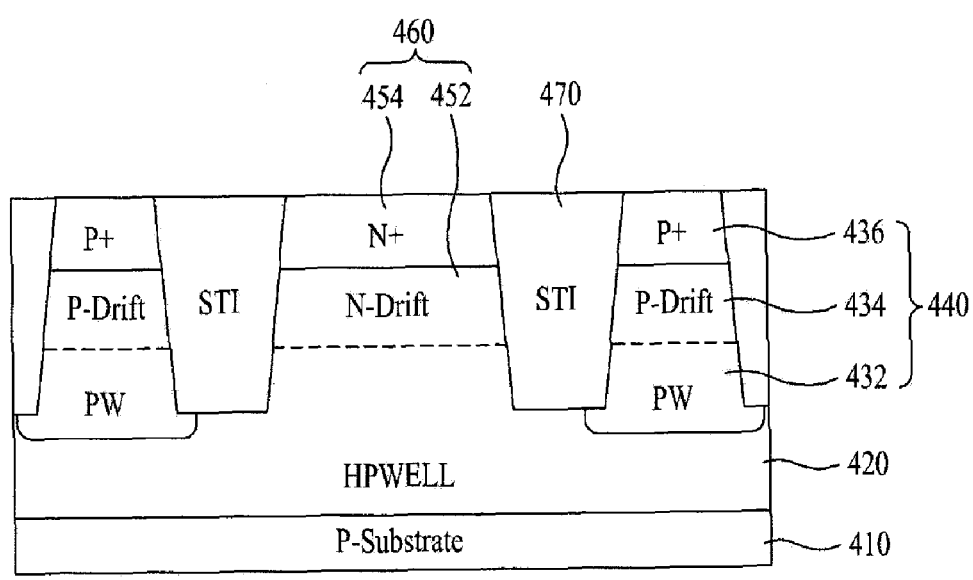

Example FIG. 4 illustrates a section of an ESD protective device in accordance with embodiments.

Figure 5:
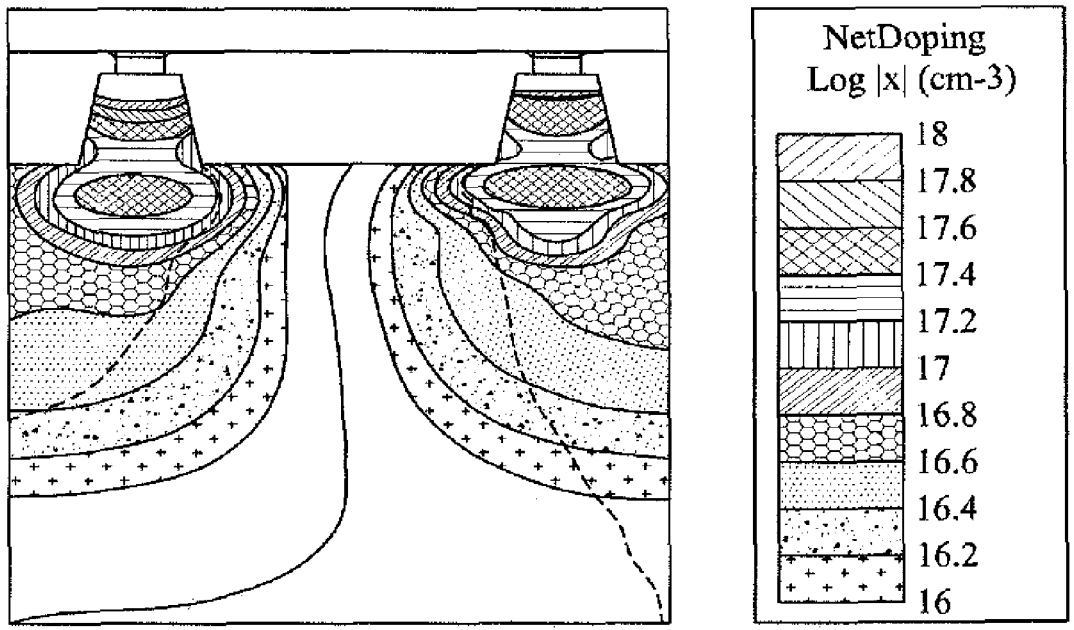

Example FIG. 5 illustrates a net doping profile of a first stacked region in example FIG. 4.

DESCRIPTION

Example FIG. 2 illustrates a section of an ESD protective device 200 in accordance with embodiments. As shown in example FIG. 2, the ESD protective device 200 may include a semiconductor substrate 210, a high voltage first conductivity type (for an example, a P type) well 215, a device isolation film 220, a first conductivity type drift region 230, a first conductivity type impurity region 240, a second conductivity type (for an example, an N type) drift region 250, and a second conductivity type impurity region 260. Though the first conductivity type is a P type, and the second conductivity type is an N type in example FIG. 2, embodiments are not limited to this, but the first conductivity type may be an N type, and the second conductivity type may be a P type.

The semiconductor substrate 210 may be a first conductivity type silicon substrate. The high voltage first conductivity type well 215 can be formed by implanting P type impurities, for example, boron, into a region of the semiconductor substrate 210. Each of the first conductivity type drift region 230 and the first conductivity type impurity region 240 may be formed by implanting P type impurity ions into the high voltage first conductivity type well 215. In this instance, the first conductivity type drift region 230 and the first conductivity type impurity region 240 can be formed by using a step for forming a drift region, a source, and a drain of a low voltage device without adding an ion injection step.

The first conductivity type impurity region 240 may be formed on a portion of an upper surface of the high voltage first conductivity type well 215 and the first conductivity type drift region 230 may be formed under the first conductivity type impurity region 240. The first conductivity type impurity region 240 can be an anode region of a diode.

The second conductivity type drift region 250 and the second conductivity type impurity region 260 may be formed by injecting N type impurity ions, for an example, phosphorus, into the high voltage first conductivity type well 215. The second conductivity type impurity region 260 may be formed on the other portion of the upper surface of the high voltage first conductivity type well 215, and the second conductivity type drift region 250 may be formed under the second conductivity type impurity region 260. The second conductivity type impurity region 260 can be a cathode region of the diode.

The first conductivity type drift region 230 and the first conductivity type impurity region 240 may be isolated from the second conductivity type drift region 250 and the second conductivity type impurity region 260 by the device isolation film 220. For an example, the device isolation film 220 may be formed between a first stack region 270 having a vertical stack of the first conductivity type drift region 230 and the first conductivity type impurity region 240 and a second stack region 280 having a vertical stack of the second conductivity type drift region 250 and the second conductivity type impurity region 260, and the first stack region 270 may be formed on opposite sides of the second stack region 280. The first stack region 270 may be referred to as a pick-up region or a guard ring region.

The device isolation film 220 can be formed deeper than the first stack region 270 and the second stack region 280 in the high voltage first conductivity type well 215 by an STI (Shallow Trench Isolation) technology.

Example FIG. 3 illustrates a net doping profile of the first stack region in example FIG. 2. As shown in example FIG. 3, the first conductivity type drift region 230 may have an impurity concentration lower than an impurity concentration of the first conductivity type impurity region 240. However, since P type impurities may be implanted to form the first conductivity type drift region 230, net doping of the first stack region 270 increases. When a current flows from the high voltage first conductivity type well 215 through a path between the first conductivity type impurity region 240 and the second conductivity type impurity region 260, because the path is shortened, and net doping of the guard ring 270 increases, resistance of the path can be reduced.

Example FIG. 4 illustrates a section of an ESD protective device 400 in accordance with embodiments. As shown in example FIG. 4, the ESD protective device 400 may include a semiconductor substrate 410, a high voltage first conductivity type (for an example, a P type) well 420, a first conductivity type well 432, a first conductivity type drift region 434, a first conductivity type impurity region 436, a second conductivity type (for an example, an N type) drift region 452, a second conductivity type impurity region 454, and a device isolation film 470. Though the first conductivity type is a P type, and the second conductivity type is an N type in example FIG. 2, embodiments are not limited to this, but the first conductivity type may be an N type, and the second conductivity type may be a P type.

The semiconductor substrate 410 may be a first conductivity type silicon substrate. The high voltage first conductivity type well 420 can be formed at a region of the semiconductor substrate 410. There may be a first stack region 440 formed in one region of the high voltage first conductivity type well 420 having the first conductivity type well 432, the first conductivity type drift region 434, and the first conductivity type impurity region 436 vertically stacked in succession up to a surface of the semiconductor substrate.

For an example, the first conductivity type drift region 434 can be formed by injecting first conductivity type impurities into the one region of the high voltage first conductivity type well 420. The first conductivity type impurity region 436 can be formed on the first conductivity type drift region 434 by injecting first conductivity type impurities into the first conductivity type drift region 434.

In this instance, the P-drift region 434 and the first conductivity type impurity region 436 can be formed by using a step for forming a drift region and source/drain regions of a low voltage device without addition of an ion injection step.

There may be a second stack region 460 formed in the other region of the high voltage first conductivity type well 420 having the second conductivity type drift region 452 and the second conductivity type impurity region 454 stacked therein. For example, the second conductivity type drift region 452 can be formed by injecting second conductivity type impurity ions into the other region of the high voltage first conductivity type well 420. The second conductivity type impurity region 454 can be formed on the second conductivity type drift region 452 by injecting second conductivity type impurity ions into the second conductivity type drift region 452.

The device isolating film 470 may be formed between the first stack region 440 and the second stack region 460 for isolating the first stack region 440 from the second stack region 460. The first stack region 440 is formed on opposite sides of the second stack region 460. The device isolating film 470 can be formed in the high voltage first conductivity type well 420 deeper than the first conductivity type drift region 434 and shallower than the first conductivity type well 432.

Example FIG. 5 illustrates a net doping profile of the first stacked region 440 in example FIG. 4. As shown in example FIG. 5, the first conductivity type well 432 may have an impurity concentration lower than an impurity concentration of the first conductivity type drift region 434, and the first conductivity type drift region 434 may have an impurity concentration lower than an impurity concentration of the first conduction impurity region 436.

However, if compared to the impurity doping profile in example FIG. 3, owing to the additional first conductivity type impurity doping for forming the first conductivity type well 432, the net doping in example FIG. 5 has an increased profile, providing a greater path resistance reduction effect in comparison to example FIG. 3.

As has been described, the device for protecting a semiconductor device from electrostatic discharge, and the method for fabricating the same of embodiments has the following advantage. The formation of a stack structure which increases net doping of the guard ring permits a reduction in the resistance between the anode and cathode of the ESD protective device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for fabricating a high voltage device, comprising:

forming a high voltage first conductivity type well by injecting first conductivity type impurities into a semiconductor substrate;

forming a first stack region having a first conductivity type drift region and a first conductivity type impurity region stacked in succession in the high voltage first conductivity type well by injecting first conductivity type impurities into the first stack region of the high voltage first conductivity type well;

forming a second stack region having a second conductivity type drift region and a second conductivity type impurity region stacked in succession in the high voltage first conductivity type well by injecting second conductivity type impurities into the high voltage first conductivity type well; and forming a device isolation film between the first stack region and the second stack region for isolating the first stack region from the second stack region, wherein the device isolating film in the high voltage first conductivity type well is deeper than the first stack region and the second stack region.

2. The method of claim 1, wherein the step for forming a first stack region includes forming a first conductivity type drift region by injecting first conductivity type impurities into the high voltage first conductivity type well.

3. The method of claim 2, wherein the step for forming a first stack region includes forming a first conductivity type impurity region by injecting first conductivity type impurities into the first conductivity type drift region.

4. The method of claim 1, wherein the step for forming a first stack region includes the step of forming the high voltage first conductivity type well under the first conductivity type drift region by injecting first conductivity type impurities into the high voltage first conductivity type well.

5. The method of claim 4, wherein the step for forming a first stack region includes the step of forming the high voltage first conductivity type well under the first conductivity type drift region by injecting first conductivity type impurities into the high voltage first conductivity type well.

6. The method of claim 1, wherein the step for forming a device isolation film includes forming the device isolation film in the high voltage first conductivity type well deeper than the first conductivity type drift region.

7. The method of claim 1, wherein the step for forming a device isolation film includes forming the device isolation film in the high voltage first conductivity type well shallower than the high voltage first conductivity type well.

8. The method of claim 1, wherein the second conduction type impurity region is a cathode region of a diode.

9. The method of claim 8, wherein the first conductivity type impurity region is an anode region of a diode.

10. The method of claim 9, wherein the diode is capable of protecting a semiconductor device from electrostatic discharge.

11. The method of claim 9, wherein the high voltage first conductivity type well has an impurity concentration lower than an impurity concentration of the first conductivity type drift region, and the first conductivity type drift region has an impurity concentration lower than an impurity concentration of the first conductivity impurity region.

12. The method of claim 1, wherein the first conductivity type is P type and the second conductivity type is N type, or the first conductivity type is N type and the second conductivity type is P type.

* * * * *